United States Patent
Sawa et al.

(10) Patent No.: US 7,932,505 B2
(45) Date of Patent: Apr. 26, 2011

(54) PEROVSKITE TRANSITION METAL OXIDE NONVOLATILE MEMORY ELEMENT

(75) Inventors: Akihito Sawa, Tsukuba (JP); Takeshi Fujii, Hachioji (JP); Masashi Kawasaki, Tsukuba (JP); Yoshinori Tokura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 384 days.

(21) Appl. No.: 11/886,776

(22) PCT Filed: Mar. 23, 2006

(86) PCT No.: PCT/JP2006/305775
§ 371 (c)(1),
(2), (4) Date: Sep. 20, 2007

(87) PCT Pub. No.: WO2006/101151
PCT Pub. Date: Sep. 28, 2006

(65) Prior Publication Data
US 2009/0050868 A1 Feb. 26, 2009

(30) Foreign Application Priority Data
Mar. 23, 2006 (JP) ................. 2005-084913

(51) Int. Cl.
*H01L 45/00* (2006.01)
(52) U.S. Cl. ............ 257/2; 257/183; 257/E49.001
(58) Field of Classification Search .............. 257/2, 183, 257/200, 201, E49.001, E49.002
See application file for complete search history.

(56) References Cited

U.S. PATENT DOCUMENTS

| | | | |
|---|---|---|---|
| 6,166,947 A * | 12/2000 | Asamitsu et al. | |
| 7,485,937 B2 | 2/2009 | Tokura et al. | |
| 2001/0032995 A1* | 10/2001 | Maria et al. | 257/310 |
| 2003/0219534 A1* | 11/2003 | Zhuang et al. | |
| 2004/0061180 A1* | 4/2004 | Hsu et al. | |
| 2004/0135183 A1* | 7/2004 | Matsuura et al. | 257/295 |
| 2006/0002174 A1* | 1/2006 | Hosoi et al. | |
| 2006/0011942 A1* | 1/2006 | Kim et al. | |
| 2007/0212572 A1 | 9/2007 | Tokura et al. | |
| 2009/0034060 A1 | 2/2009 | Tokura et al. | |

(Continued)

FOREIGN PATENT DOCUMENTS
JP  10-255481  * 9/1998
(Continued)

OTHER PUBLICATIONS

Sawa, A. et al. "Hysteretic Current-Voltage Characteristics and Resistance Switching at a Rectifying Ti/Pr0.7Ca0.3MnO3 Interface". Applied Physics Letters, vol. 85, No. 18 (pp. 4073-4075). Nov. 1, 2004.*

(Continued)

*Primary Examiner* — Tom Thomas
*Assistant Examiner* — Christopher M Roland
(74) *Attorney, Agent, or Firm* — Nixon & Vanderhye P.C.

(57) ABSTRACT

Provided is a material composition which allows a nonvolatile memory element made of a perovskite-type transition metal oxide having the CER effect to be formed of three elements, which comprises an electric conductor having a shallow work function or a small electronegativity, such as Ti, as an electrode and a rare earth-copper oxide comprising one type of rare earth element, copper and oxygen, such as $La_2CuO_4$, as a material constituting a heterojunction with the electric conductor.

7 Claims, 2 Drawing Sheets

U.S. PATENT DOCUMENTS

2009/0137398 A1* 5/2009 Bozovic et al. ............... 505/220
2010/0243980 A1* 9/2010 Fukumizu ....................... 257/2

FOREIGN PATENT DOCUMENTS

JP        2006-19444      *   1/2006
JP        2006-32898      *   2/2006

OTHER PUBLICATIONS

Newns, D. M. et al. "Mott Transition Field Effect Transistor". Applied Physics Letters, vol. 72, No. 6 (pp. 780-782). Aug. 10, 1998.*

Sawa, A. et al. "Colossal Electro-Resistance Memory Effect at Metal/La2CuO4 Interfaces". Japanese Journal of Applied Physics, vol. 44, No. 40 (pp. L1241-L1243). Sep. 26, 2005.*

Sawa, A. "Resistive Switching in Transition Metal Oxides". Materials Today, vol. 11, No. 6 (pp. 28-36). Jun. 2008.*

Tulina, et al.—"Reversible electrical switching at the $Bi_2Sr_2CaCu_2O_{8+y}$ surface in the normal metal—$Bi_2Sr_2CaCu_2O_8$+y single crystal heterojunction"—Physica C (2001), pp. 23-30.

U.S. Appl. No. 11/886,734 filed Sep. 19, 2007 entitled "Nonvolatile Memory Element".

International Search Report mailed Apr. 25, 2006.*

Baikalov et al.: "Field-driven hysteretic and reversible resistive switch at the Ag-$Pr_{0.7}Ca_{0.3}MnO_3$ interface;" *Applied Physics Letters*, vol. 83, No. 5, Aug. 4, 2003, pp. 957-959.*

Tsui et al.: "Field-induced resistive switching in metal-oxide interfaces," *Applied Physics Letters*, vol. 85, No. 2, Jul. 12, 2004, pp. 317-319.*

Tulina et al.: "Reversible electrical switching at the $Bi_2Sr_2CaCu_2O_{8+y}$ surface in the normal metal—$Bi_2Sr_2CaCu_2O_{8+y}$ single crystal heterojunction," *Physica*, C 366 (2001) pp. 23-30.*

* cited by examiner

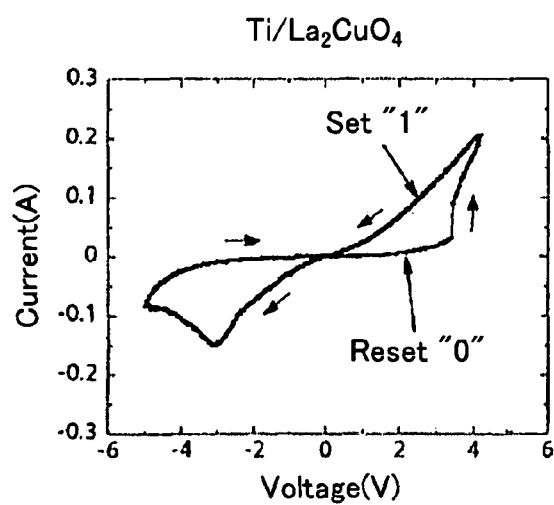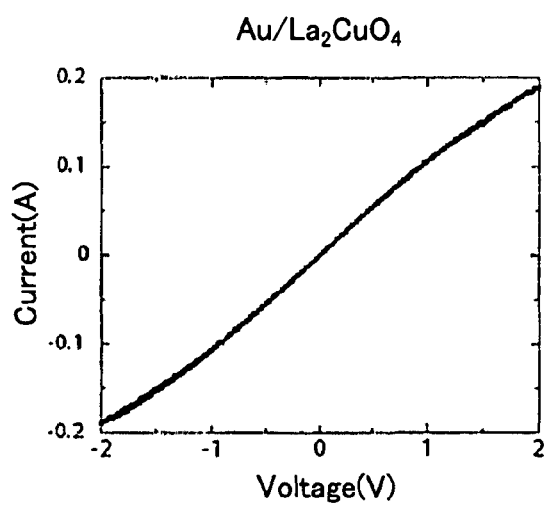
Fig. 2A                               Fig. 2B

US 7,932,505 B2

PEROVSKITE TRANSITION METAL OXIDE NONVOLATILE MEMORY ELEMENT

CROSS-REFERENCE TO RELATED APPLICATIONS

This application is a National Phase filing under 35 U.S.C. §371 of International Application No. PCT/JP2006/305775 filed on Mar. 23, 2006, and which claims priority to Japanese Patent Application No. 2005-084913 filed on Mar. 23, 2005.

TECHNICAL FIELD

The present invention relates to a nonvolatile memory, and in particular, to a 1T1R type nonvolatile memory element where a rare earth-copper oxide is used.

BACKGROUND ART

With the discovery of high temperature superconductivity in copper oxides as a turning point, perovskite-type oxides including various types of transition metals have been drawing attention, and diligent research has been conducted. In addition, the discovery of colossal magneto-resistance (hereinafter referred to as CMR) effects, where change in electrical resistivity spans over many digits as a phenomenon of a type of magnetic field melting of a charge ordered phase in a perovskite-type Mn oxide in the continuing process of design and development of related substances has spurred more and more research.

In addition, colossal electro-resistance (hereinafter referred to as CER) changing effects, which is a phenomenon similar to CMR in perovskite-type transition metal oxides, such as $Pr_{0.7}Ca_{0.3}MnO_3$, induced through application of an electrical field or current, were discovered, and a memory element using CER effects is introduced in Patent Document 1.

Patent Document 2 introduces a nonvolatile memory element having a structure where a perovskite-type transition metal oxide exhibiting CER effects as $Pr_{0.7}Ca_{0.3}MnO_3$, is used for a semiconductor switch layer, and this semiconductor switch layer is sandwiched between metal electrodes. A resistance random access memory (hereinafter referred to as RRAM) formed of nonvolatile memory elements using this perovskite-type transition metal oxide is characterized by high speed operation, low power consumption, nondestructive readout and the like, in addition to nonvolatile properties, and therefore, expected to substitute DRAM's, SRAM's and flash memories as a universal memory, and thus, development thereof has been progressing.

In recent years, it has been reported that CER effects occur at the interface between a perovskite-type oxide and another metal material. As perovskite-type Mn oxides exhibiting such CER effects, a large number of materials, for example $Pr_{1-x}Ca_xMnO_3$, $Pr_{1-x}(Ca, Sr)_xMnO_3$ and $Nd_{0.5}Sr_{0.5}MnO_3$, are known. In addition, perovskite-type copper oxides, such as $Bi_2Sr_2CaCu_2O_{8+y}$, $RuSr_2GdCu_2O_3$ and the like are known. Furthermore, a great number of nonvolatile memories, for example, of the 1T1R type, where CER effects gained by the above described oxides are controlled by a current or an electrical field have been proposed.

It has been reported that electrical conductive properties, including CER effects of the above described perovskite-type Mn oxides and copper oxides, which are intensely correlated electron materials, change greatly due to changes in the concentration of charge and changes in the crystal structure caused by slight changes in the composition. Therefore, it is necessary to control precisely the composition of the perovskite-type Mn-oxide and the copper-oxide material thin films, in order to secure uniformity and reproducibility for the element operation properties when a nonvolatile memory element where CER effects are controlled by a current or an electrical field is fabricated.

The above described perovskite-type Mn oxides and copper oxides, however, are compounds formed of four or more elements, and therefore, there is a drawback, such that it is difficult to control the composition when a thin film is fabricated for an element.

Patent Document 1: Japanese Unexamined Patent Publication No. H10 (1998)-255481
Patent Document 2: Japanese Unexamined Patent Publication No. 2003-338607
Patent Document 3: Japanese Unexamined Patent Publication No. 2004-119958
Non-Patent Document 1: Physica C Vol. 366, p. 23 (2001)
Non-Patent Document 2: Appl. Phys. Lett. Vol. 83, No. 5, p. 957 (2003)
Non-Patent Document 3: Appl. Phys. Lett. Vol. 85, No. 12, p. 317 (2004)

SUMMARY

In view of the above-described problems with the prior art, an object of the invention is to provide a material composition which allows a memory element made of a perovskite-type transition metal oxide having CER effects to be formed of three elements.

In order to achieve the above-described object, an aspect of the present invention provides a nonvolatile memory element having a heterojunction between a metal having a shallow work function or a small electronegativity and a rare earth-copper oxide made of one type of rare earth, copper and oxygen.

A second aspect of the present invention provides a nonvolatile memory element where the rare earth-copper oxide made of a rare earth R, copper and oxygen is $R_2CuO_4$, specifically, $La_2CuO_4$.

A third aspect of the present invention provides a nonvolatile memory element where Ti is used as the metal having a shallow work function or a small electronegativity.

A fourth aspect of the present invention provides a nonvolatile memory element having a conductor having a deep work function as the ohmic electrode of the above described rare earth-copper oxide.

The number of types of elements that form the rare earth-copper oxide made of one type of rare earth, copper and oxygen is three, and thus, the number of elements forming the rare earth-copper oxide is smaller in comparison with the prior art, in order to gain CER effects, and therefore, fabrication of a thin film for an element becomes easy.

BRIEF DESCRIPTION OF THE DRAWINGS

FIGS. 2A and 2B are graphs showing the current-voltage properties of nonvolatile memory elements.

DETAILED DESCRIPTION

Figure 1:
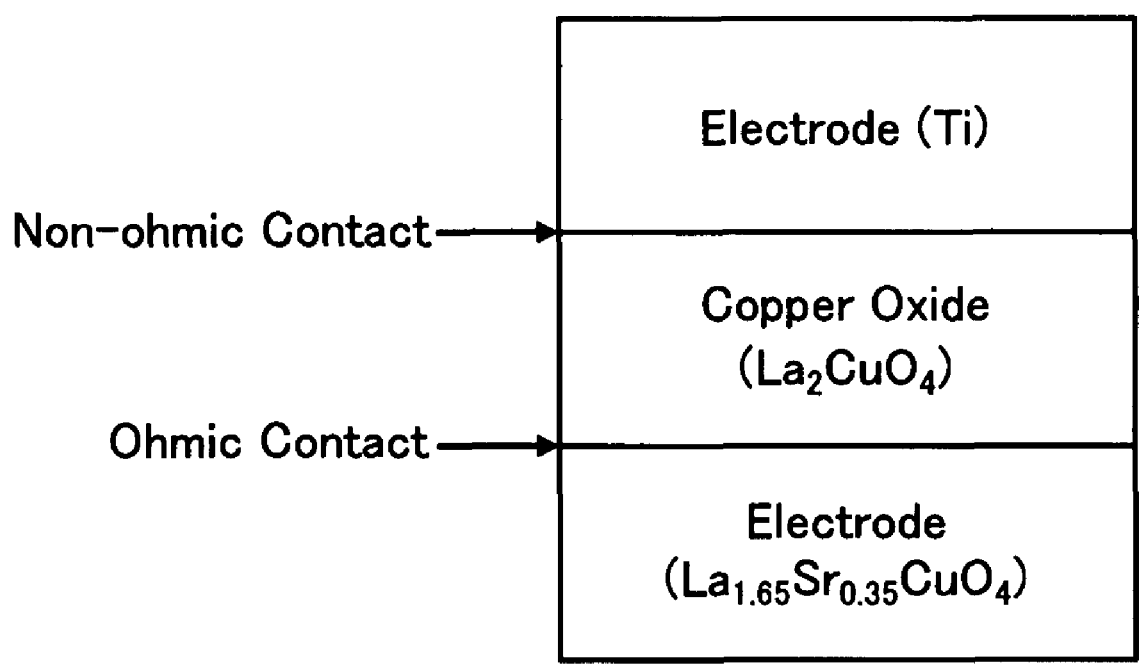
FIG. 1 is a cross sectional diagram of an example nonvolatile memory element.

In the following, the best mode for carrying out the present invention is described in detail on the basis of exemplary embodiments.

EXAMPLES

FIG. 1 is a cross sectional diagram showing a nonvolatile memory element using a rare earth-copper oxide according to an aspect of the present invention, and the method for fabricating this is as follows.

First, a metal having a deep work function, such as $La_{1.65}Sr_{0.35}CuO_4$, which becomes an ohmic electrode, was formed on a single crystal substrate of $LaSrAlO_4$ oxide, which is an insulator, so as to have a thickness of 100 nm through pulse laser deposition under such conditions for fabrication that the temperature of the substrate was 800° C. and the oxygen pressure was 250 mTorr. Subsequently, $La_2CuO_4$, which became a p type semiconductor, was formed on top of this under the same conditions for fabrication so as to have a thickness of 100 nm, and then, the temperature was lowered to 400° C. and an annealing process was carried out for 30 minutes under an oxygen pressure of 400 Torr.

After that, a metal having a shallow work function or a small electronegativity, such as Ti, was formed on the $La_2CuO_4$ through electron beam deposition at room temperature so as to have a thickness of 80 nm, and thus, a $Ti/La_2CuO_4/La_{1.65}Sr_{0.35}CuO_4$ multilayer structure was fabricated. The fabricated multilayer structure was processed through photolithography and Ar ion milling so as to have an element area of 100 µm×100 µm, and thus, a memory element made of a $Ti/La_2CuO_4/La_{1.65}Sr_{0.35}CuO_4$ junction was gained.

FIG. 2A is a graph showing the results of measurement of the current-voltage properties of the memory element according to the aspect of the present invention at room temperature. In FIG. 2A, the plus direction is the direction in which a current flows from the lower portion to the upper portion of the memory element shown in FIG. 1. According to FIG. 2A, when a voltage in the plus direction was applied to the element, the value of the current which flows through the element under a voltage which was no lower than a certain threshold voltage (approximately 3.5 V in FIG. 2A) abruptly changed, and thus, the resistance state of the element transitioned to a low resistance state. Even when the voltage was lowered afterwards, this low resistance state was maintained. Furthermore, when the polarity of the voltage applied to the element was turned to minus, the value of the current abruptly changed under a voltage which was no higher than a certain threshold voltage (approximately 3 V in FIG. 2A), and thus, the resistance state transitioned to a high resistance state. Even when the voltage was returned afterwards, a high resistance state was maintained.

That is to say, electrical field or current induced resistance changing memory effects were gained, so that a voltage of no lower than the threshold voltage was applied by changing the polarity of the voltage applied to the element, and thus, the state of the resistance in the element changed reversibly between a low resistance state and a high resistance state. When a low resistance state in the element is defined as set "1" and a high resistance state is defined as reset "0," the voltage for reading out the state of the resistance in the element can be set at any voltage between the threshold voltage in the plus direction and the threshold voltage in the minus direction, and thus, it becomes possible to nondestructively read out the state of the resistance in the element.

FIG. 2B is for comparing the memory element shown in FIG. 1 with a memory element where Au, which is a conductor having a deep work function, is used for the electrode instead of Ti. In this case, the current-voltage properties are ohmic properties with no hysteresis, and therefore, no electrical field or current induced resistance changing memory effects are gained. Accordingly, the electrical properties at the interface between Ti and $La_2CuO_4$ are such that there is non-ohmic contact in the nonvolatile memory element using a rare earth-copper oxide according to an aspect of the present invention, and it can be seen that the current-voltage properties with hysteresis as shown in FIG. 2A take place at this interface. Here, Au in the comparative example can be used as ohmic contact with $La_2CuO_4$.

Though in the present example, $La_2CuO_4$ was used as the copper oxide having CER effects, a copper oxide of an element which belongs to rare earths, as does La, for example, $Nd_2CuO_4$, may be used instead of that above. In addition, though Ti is used as the metal having a shallow work function, Al, Nb, Ta, Zr, V, Mg, TaN, TiN and the like, which are metals having a shallow work function or a small electronegativity, or alloys or compounds of these may be used. Furthermore, though $La_{1.65}Sr_{0.35}CuO_4$ was used as the conductor for making ohmic contact with $La_2CuO_4$, Pt, Au, Re, Ir, $IrO_2$, $RuO_2$ and the like which are metals having a deep work function, may be used.

The invention claimed is:

1. A nonvolatile memory element, comprising:
   an electrode; and
   a switch layer comprising a CER (colossal-electro resistance) material, said CER material being a three-element rare earth, copper and oxygen combination exhibiting a CER effect,
   wherein said electrode and said switch layer are structured to form a non-ohmic contact at an interface therebetween, and
   wherein said electrode and said switch layer are structured such that current-voltage properties of said nonvolatile memory element exhibit hysteresis in which
       when a voltage higher than or equal to an upper threshold voltage is applied across said nonvolatile memory element, a switch layer resistance is set to one of high and low resistance states,
       when a voltage lower than or equal to a lower threshold voltage is applied across said nonvolatile memory element, said switch layer resistance is set to the other of said high and low resistance states, and
       when a voltage in between said upper and lower threshold voltages is applied across said nonvolatile memory element, said switch layer resistance is maintained at one of said high and low resistance states.

2. The nonvolatile memory element according to claim 1, wherein said electrode is a metal having a shallow work function or a small electronegativity.

3. The nonvolatile memory element according to claim 2, wherein said electrode is formed of any one or more of Ti, Al, Nb, Ta, Zr, V, Mg, TaN, and TiN, and any alloys or compounds thereof, and
   wherein said switch layer is formed of one or both of $La_2CuO_4$ and $Nd_2CuO_4$.

4. The nonvolatile memory element according to claim 1, wherein said electrode is a top electrode structured to contact said switch layer at a top surface of said switch layer, said nonvolatile memory element further comprising:
   a bottom electrode structured to contact said switch layer at a bottom surface thereof to form an ohmic contact an interface therebetween.

5. The nonvolatile memory element according to claim 4, wherein said top electrode is a metal having a shallow work function or a small electronegativity, and said bottom electrode is a metal having a deep work function.

6. The nonvolatile memory element according to claim 5, wherein said top electrode is formed of any one or more of Ti, Al, Nb, Ta, Zr, V, Mg, TaN, and TiN, and any alloys or compounds thereof,
wherein said switch layer is formed of one or both of $La_2CuO_4$ and $Nd_2CuO_4$, and
wherein said bottom electrode is formed of any of one or more of $La_{1.65}Sr_{0.35}CuO_4$, Pt, Au, Re, Ir, $IrO_2$, and $RuO_2$.

7. The nonvolatile memory element according to claim 5, wherein said top electrode is formed of Ti, said switch layer is formed of $La_2CuO_4$, and said bottom electrode is formed of $La_{1.65}Sr_{0.35}CuO_4$.

* * * * *